(12) United States Patent
Lee et al.

(10) Patent No.: US 7,989,920 B2
(45) Date of Patent: *Aug. 2, 2011

(54) PHASE CHANGE MEMORY

(75) Inventors: Tzyh-Cheang Lee, Hsin-Chu (TW);
Ming-Yi Yang, Ping-Tung (TW);
Fu-Liang Yang, Hsin-Chu (TW); Denny Duan-lee Tang, Saratoga, CA (US)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 12/703,571

(22) Filed: Feb. 10, 2010

(65) Prior Publication Data

US 2010/0140580 A1    Jun. 10, 2010

Related U.S. Application Data

(63) Continuation of application No. 11/749,017, filed on May 15, 2007, now Pat. No. 7,705,424.

(51) Int. Cl.
*H01L 29/00*    (2006.01)
(52) U.S. Cl. ................ 257/536; 257/E45.001; 257/537
(58) Field of Classification Search ................ 257/536, 257/537, E45.001, E45.002
See application file for complete search history.

(56) References Cited

U.S. PATENT DOCUMENTS

| | | | |
|---|---|---|---|
| 6,314,014 B1 | 11/2001 | Lowrey et al. | |
| 6,816,404 B2 | 11/2004 | Khouri et al. | |
| 6,891,747 B2 | 5/2005 | Bez et al. | |
| 6,894,305 B2 | 5/2005 | Yi et al. | |
| 7,042,001 B2 | 5/2006 | Kim et al. | |
| 7,110,286 B2 | 9/2006 | Choi et al. | |
| 7,422,926 B2 | 9/2008 | Pellizzer et al. | |
| 7,705,424 B2 * | 4/2010 | Lee et al. | 257/536 |
| 2004/0245603 A1 | 12/2004 | Lowrey et al. | |
| 2006/0097341 A1 | 5/2006 | Pellizzer et al. | |

OTHER PUBLICATIONS

Happ, T.D., et al., "Novel One-Mask Self-Heating Pillar Phase Change Memory," Symposium on VLSI Technology Digest of Technical Papers, IEEE, 2006, 2 pgs.
Lai, S., et al., "OUM—A 180 nm Nonvolatile Memory Cell Element Technology for Stand Alone and Embedded Applications," IEDM, 2001, pp. 803-806.
Oh, J.H., et al., "Full Integration of Highly Manufacturable 512Mb PRAM Based on 90nm Technology," IEDM, 2006, 4 pgs.
Pellizzer, F., et al., "Novel µTrench Phase-Change Memory Cell for Embedded and Stand-Alone Non-Volatile Memory Applications," Symposium on VLSI Technology Digest of Technical Papers, IEEE, 2004, pp. 18-19.

* cited by examiner

*Primary Examiner* — Zandra Smith
*Assistant Examiner* — Paul E Patton
(74) *Attorney, Agent, or Firm* — Slater & Matsil, L.L.P.

(57) ABSTRACT

A phase change memory is provided. The method includes forming contact plugs in a first dielectric layer. A second dielectric layer is formed overlying the first dielectric layer and a trench formed therein exposing portions of the contact plugs. A metal layer is formed over surfaces of the trench. One or more heaters are formed from the metal layer such that each heater is formed along one or more sidewalls of the trench, wherein the portion of the heater along the sidewalls does not include a corner region of adjacent sidewalls. The trench is filled with a third dielectric layer, and a fourth dielectric layer is formed over the third dielectric layer. Trenches are formed in the fourth dielectric layer and filled with a phase change material. An electrode is formed over the phase change material.

20 Claims, 9 Drawing Sheets

PHASE CHANGE MEMORY

This application is a continuation of U.S. patent application Ser. No. 11/749,017, entitled "Phase Change Memory," filed on May 15, 2007, which application is incorporated herein by reference.

TECHNICAL FIELD

The present invention relates generally to semiconductor structures and, more particularly, to memory structures utilizing phase change materials.

BACKGROUND

Phase change technology is promising for next generation memory devices. It uses chalcogenide semiconductors for storing states and digital information. The chalcogenide semiconductors, also called phase change materials, have a crystalline state and an amorphous state. In the crystalline state, the phase change materials have low resistivity; while in the amorphous state, they have high resistivity. The resistivity ratios of the phase change materials in the amorphous and crystalline states are typically greater than 1000, and thus the phase change memory devices are unlikely to have errors for reading states. The chalcogenide semiconductors are stable at a certain temperature range in both crystalline and amorphous states and can be switched back and forth between the two states by electric pulses.

Typically, a phase change memory device is formed by placing a phase change material between two electrodes. Write operations, also called programming operations, which apply electric pulses to the memory device, and read operations, which measure the resistance of the phase change memory, are performed through the two electrodes. Generally, write operations utilize a set pulse and a reset pulse. The set pulse heats the phase change material to a temperature higher than a crystallization temperature $T_x$, but below a melting temperature $T_m$, for a time $t_2$ longer than the required crystalline time, for the crystallization to take place. The reset pulse, which turns the phase change material into an amorphous state, heats the phase change material to a temperature higher than the melting temperature $T_m$. The temperature is then quickly dropped below the crystallization temperature $T_x$ for a time period short enough to reduce or prevent the crystallization. The phase change material is heated by controlling the current flowing through a conductive material, commonly referred to as a "heater." The heater comprises a conductive material that, due to its resistive properties, heats up when a sufficiently high voltage differential is applied.

One of the significant challenges that the phase change memory devices face is to reduce the programming current. A commonly used technique for reducing the programming current is to reduce the contact area between the phase change material and the heater. One attempt to reduce the contact area utilized a crown-type heater. Generally, a crown-type heater utilizes a heater formed along the sidewalls and bottom of a trench. This method, however, has a low area utility efficiency, making it difficult to scale down.

Another attempt to reduce the contact area utilizes a plug-type heater, wherein the heater comprises a plug or via formed through a dielectric layer. This attempt, however, may exhibit poor performance issues related to contact area disturbances as devices are scaled down.

Yet another attempt uses a line-type heater. In this attempt, the heater is formed by a damascene process in which a trench is formed and filled with a conductive material. The phase change material is then formed over the conductive material. In this attempt, however, it may be difficult to maintain uniformity as the design shrinks.

Accordingly, there is a need for a structure that provides reduced contact area while providing a high-level of uniformity and high contact density.

SUMMARY OF THE INVENTION

These and other problems are generally solved or circumvented, and technical advantages are generally achieved, by preferred embodiments of the present invention which provides memory structures using phase change materials.

In accordance with an embodiment of the present invention, a semiconductor device is provided. The semiconductor device includes a substrate having an electrical component formed thereon and a first dielectric layer overlying the substrate. A contact plug extends through the first dielectric layer and is electrically coupled to the electrical component. A second dielectric layer overlies the first dielectric layer, the second dielectric layer having a trench exposing the contact plug. A heater extends down at least a portion of one sidewall of the trench. A third dielectric layer fills the trench and a phase change material overlies and is electrically coupled to the heater.

In accordance with another embodiment of the present invention, another semiconductor device is provided. The semiconductor device includes a substrate having an electrical component formed thereon and a contact plug electrically coupled to the electrical component. A heater is electrically coupled to the contact plug, and a phase change material overlies and is electrically coupled to the heater. The heater has a first portion along at least one sidewall of the trench, the first portion being cornerless.

In accordance with yet another embodiment of the present invention, another semiconductor device is provided. The semiconductor device comprises a substrate having a plurality of electrical components formed thereon and a first dielectric layer overlying the substrate. A plurality of contact plugs extend at least partially through the first dielectric layer to electrically couple to respective ones of the electrical components. A second dielectric layer with a trench therein overlies the first dielectric layer such that the contact plugs are exposed by the trench. A plurality of heaters is formed along one or more sidewalls of the trench, wherein the one or more sidewalls are not perpendicular to each other. A phase change layer overlies and is electrically coupled to the plurality of heaters. A top electrode overlies the phase change layer.

It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The intermediate stages of manufacturing a novel phase change memory device embodiment of the present invention are illustrated in FIGS. 1a through 7b, wherein a perspective view and a front view of each stage is provided. Throughout the various views and illustrative embodiments of the present invention, like reference numbers are used to designate like elements.

Figure 1A:
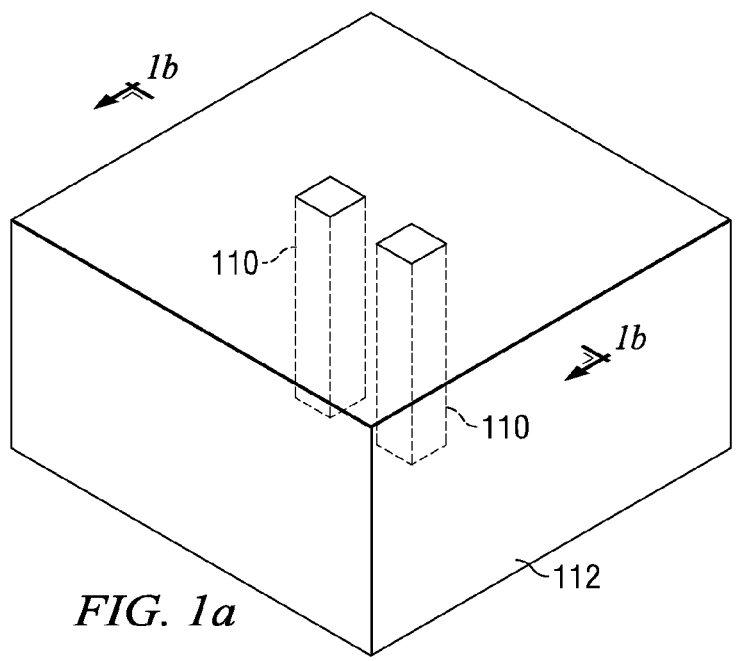
FIGS. 1a-8b illustrate a method of forming a phase change memory in accordance with an embodiment of the present invention.
Figure 1B:
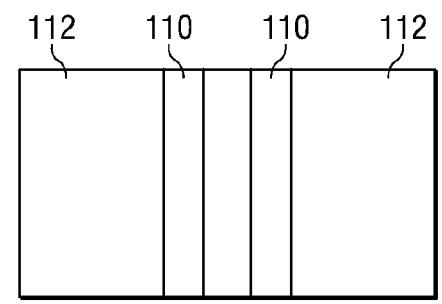

Referring first to FIGS. 1a and 1b, contact plugs 110 formed in a first dielectric layer 112 are illustrated in accordance with an embodiment of the present invention. It should be noted that the contact plugs 110 are electrically coupled electronic circuitry (not shown) formed on an underlying substrate (not shown). The circuitry formed on the substrate may be any type of circuitry suitable for a particular application. In an embodiment, the circuitry includes electronic devices formed on the substrate with one or more dielectric layers overlying the electronic devices. Metal layers may be formed between dielectric layers to route electrical signals between the electronic devices. Electrical devices may also be formed in the one or more dielectric layers.

The circuitry may include various N-type metal-oxide semiconductor (NMOS) and/or P-type metal-oxide semiconductor (PMOS) devices, such as transistors, capacitors, resistors, diodes, photo-diodes, fuses, and the like, interconnected to perform one or more functions. The functions may include memory structures, processing structures, sensors, amplifiers, power distribution, input/output circuitry, or the like. One of ordinary skill in the art will appreciate that the above examples are provided for illustrative purposes only to further explain applications of the present invention and are not meant to limit the present invention in any manner. Other circuitry may be used as appropriate for a given application.

For example, in an embodiment the contact plugs 110 are electrically coupled to source/drain regions of a transistor formed on an underlying substrate. In this manner, the transistor may be used to control the setting and resetting of the phase change material (to be formed in a subsequent step).

Generally, the first dielectric layer 112 may be formed, for example, of a low-K dielectric material, such as silicon oxide, phosphosilicate glass (PSG), borophosphosilicate glass (BPSG), fluorinated silicate glass (FSG), or the like, by any suitable method known in the art. In an embodiment, the first dielectric layer 112 comprises an oxide that may be formed by chemical vapor deposition (CVD) techniques using tetraethyl-ortho-silicate (TEOS) and oxygen as a precursor. Other materials and processes may be used. It should also be noted that the first dielectric layer 112 may comprise a plurality of dielectric layers, with or without an etch stop layer formed between adjacent dielectric layers.

The contact plugs 110 may be formed in the first dielectric layer 112 by any suitable process, including photolithography and etching techniques. Generally, photolithography techniques involve depositing a photoresist material, which is masked, exposed, and developed to expose portions of the first dielectric layer 112 that are to be removed. The remaining photoresist material protects the underlying material from subsequent processing steps, such as etching. In the preferred embodiment, photoresist material is utilized to create a patterned mask to define contact plugs 110. The etching process may be an anisotropic or isotropic etch process, but preferably is an anisotropic dry etch process. After the etching process, any remaining photoresist material may be removed. Processes that may be used to form the contact plugs 110 include single and dual damascene processes.

The contact plugs 110 may be formed of any suitable conductive material, but are preferably formed of a highly-conductive, low-resistive metal, elemental metal, transition metal, or the like, such as metals or metal alloys including one or more of Al, AlCu, Cu, Ti, TiN, W, and the like. Furthermore, the contact plugs 110 may include a barrier/adhesion layer to prevent diffusion and provide better adhesion between the contact plugs 110 and the first dielectric layer 112.

The contact plugs 110 may be formed, for example, by physical vapor deposition (PVD), atomic layer deposition (ALD), spin-on deposition, or other suitable methods. A chemical-mechanical polishing (CMP) process may be performed to remove excess conductive material and to planarize the surface of the first dielectric layer 112 and the contact plugs 110.

Figure 2A:
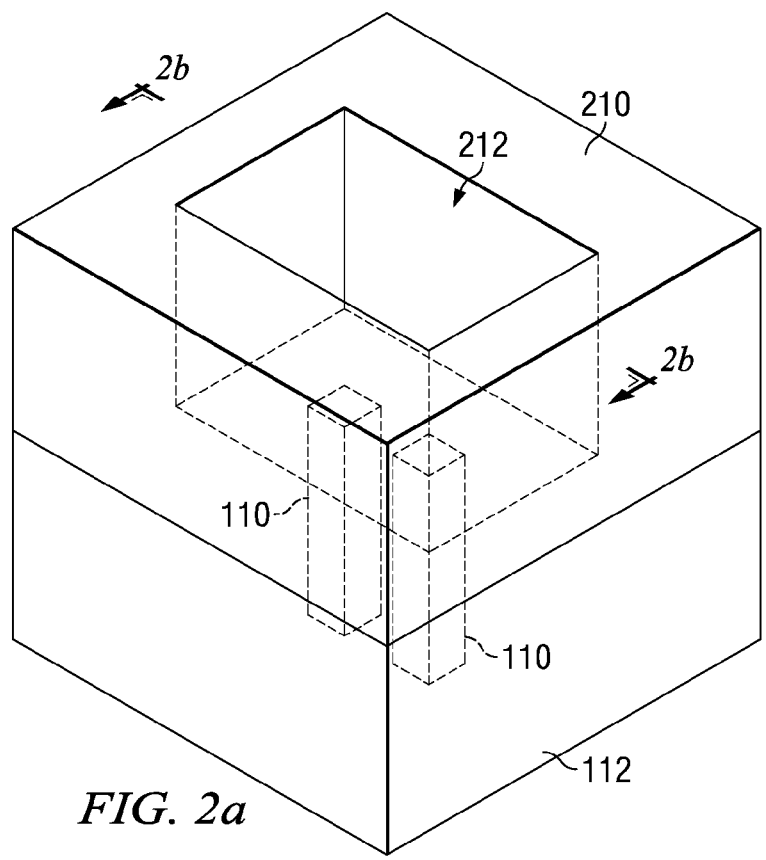
Figure 2B:
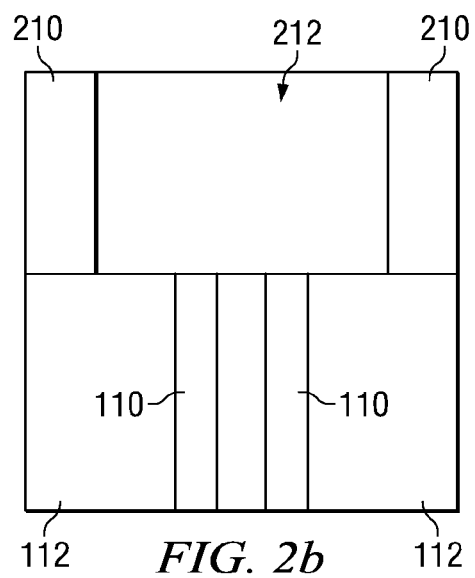

FIGS. 2a-2b illustrate forming a second dielectric layer 210 over the first dielectric layer 112 in accordance with an embodiment of the present invention. The second dielectric layer 210 may be formed of a similar material and in a similar manner as the first dielectric layer 112 discussed above with reference to FIGS. 1a-1b. Accordingly, the second dielectric layer 210 may be formed, for example, of a low-K dielectric material, such as silicon oxide, phosphosilicate glass (PSG), borophosphosilicate glass (BPSG), fluorinated silicate glass (FSG), or the like, by any suitable method known in the art. Other materials and processes may be used. It should also be noted that the second dielectric layer 210 may comprise a plurality of dielectric layers, with or without an etch stop layer formed between adjacent dielectric layers. Furthermore, an etch stop layer (not shown) may be formed between the first dielectric layer 112 and the second dielectric layer 210. In an embodiment, the second dielectric layer 210 has a thickness from about 300 Å to about 2000 Å.

Also illustrated in FIGS. 2a-2b is a heater trench 212 formed in the second dielectric layer 210 in accordance with an embodiment of the present invention. In an embodiment, the heater trench 212 is formed by photolithography and etching techniques. Accordingly, a photoresist layer (not shown) may be deposited and patterned to expose portions of the second dielectric layer 210 corresponding to the heater trench 212. Thereafter, an etching process utilizing a solution of $CF_4$, $C_5F_8$, or the like may be used to etch the second dielectric layer 210, thereby forming the heater trench 212.

Figure 3A:
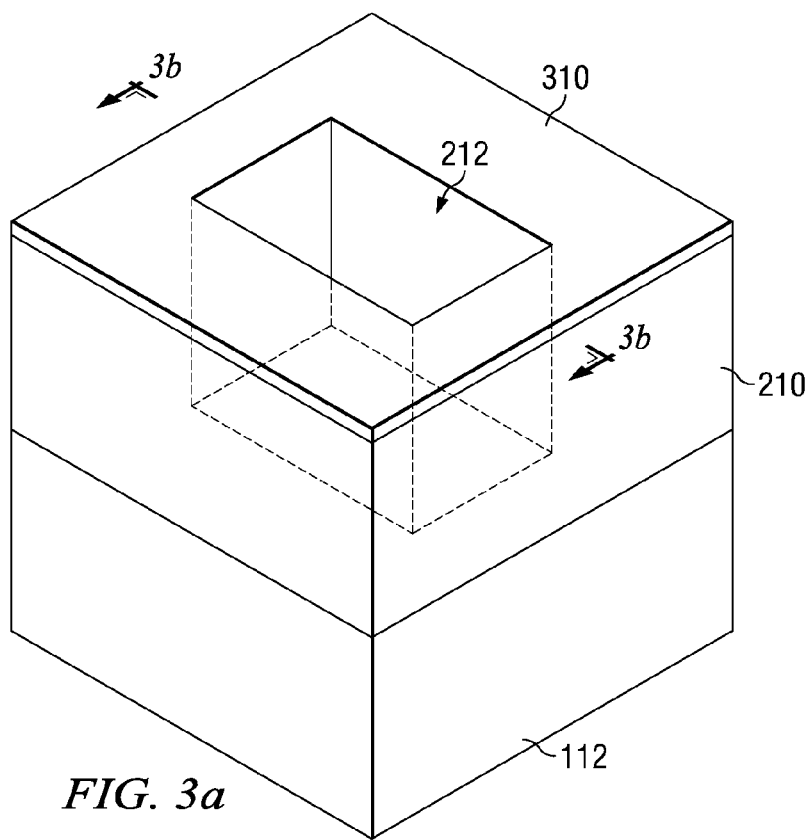
Figure 3B:
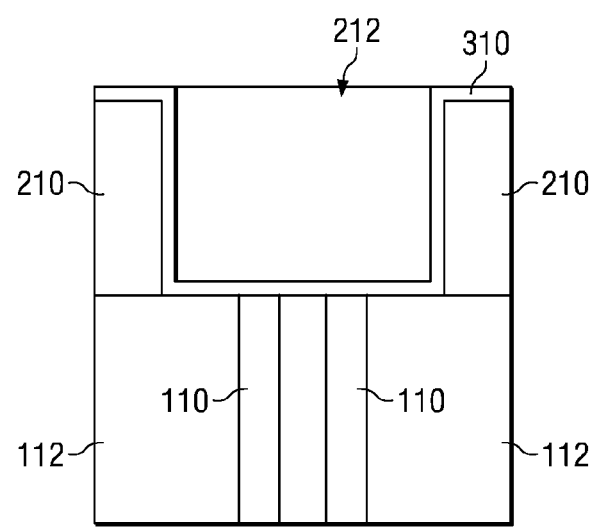

FIGS. 3a-3b illustrate a first metal layer 310 formed over a surface of the second dielectric layer 210 and the heater trench 212. It should be noted that the hidden lines corresponding to the contact plugs 110 (see FIG. 2a) are not shown in FIG. 3a to simplify the drawing and more clearly illustrate the process. In an embodiment, the first metal layer 310 comprises TiN, TaN, or the like formed by MOCVD or ALCVD process. Other materials and other processes may be used. It should be noted that the first metal layer 310 may include a plurality of layers and may include an adhesion layer to prevent or reduce peeling. The preferred thickness of first metal layer 310 is between about 50 Å and about 200 Å.

Figure 4A:
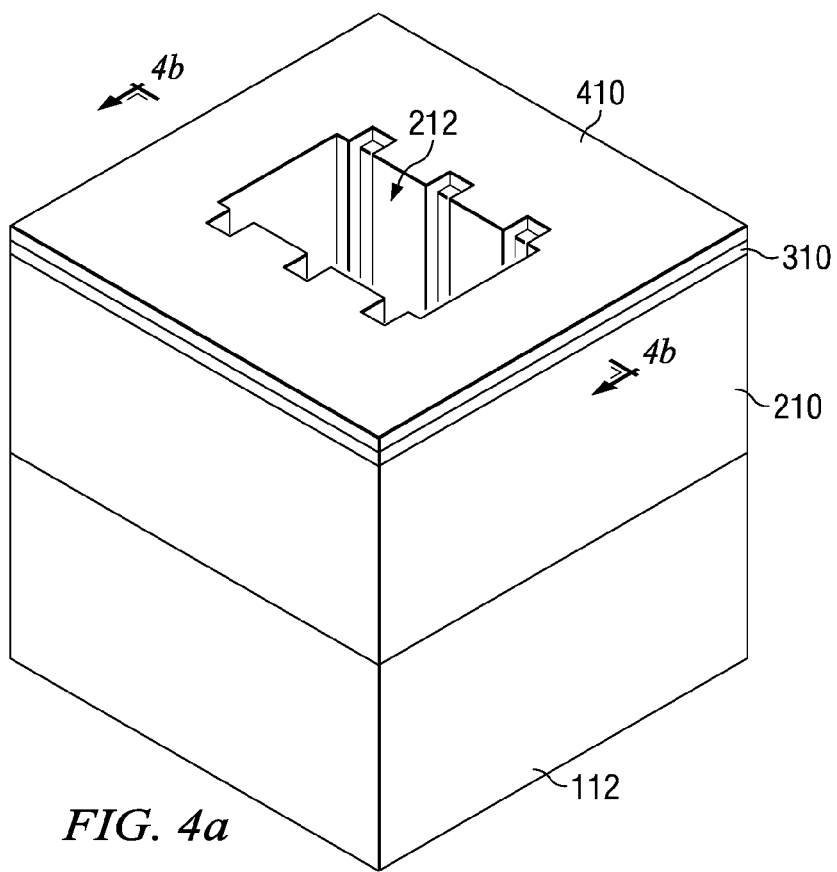
Figure 4B:
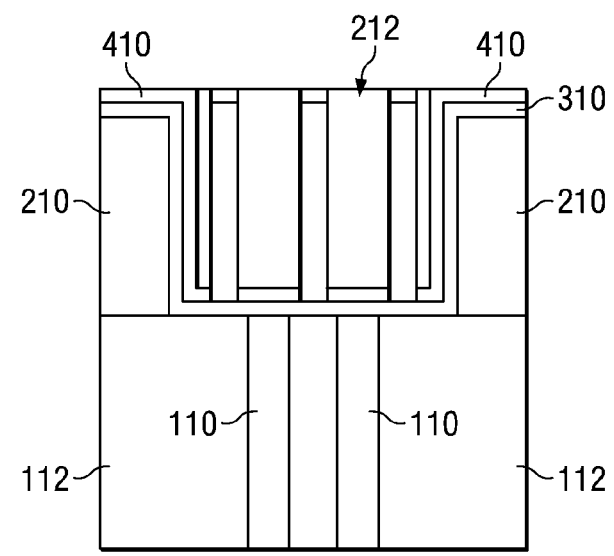

FIGS. 4a-4b illustrate a heater isolation mask 410 in accordance with an embodiment of the present invention. The heater isolation mask 410 may be any suitable masking material such as a photoresist material, a hard mask (e.g., silicon nitride, ONO mask, or the like), or the like. In an embodiment, the heater isolation mask 410 comprises a layer of photoresist material that has been patterned, exposed, and developed to form the heater isolation mask 410 as illustrated in FIGS. 4a-4b. It should be noted that the exposed portions of the underlying first metal layer 310 correspond to the region between adjacent heater elements. In other words, the exposed regions of the first metal layer 310 will be processed in subsequent processing steps to form isolation regions.

Figure 5A:
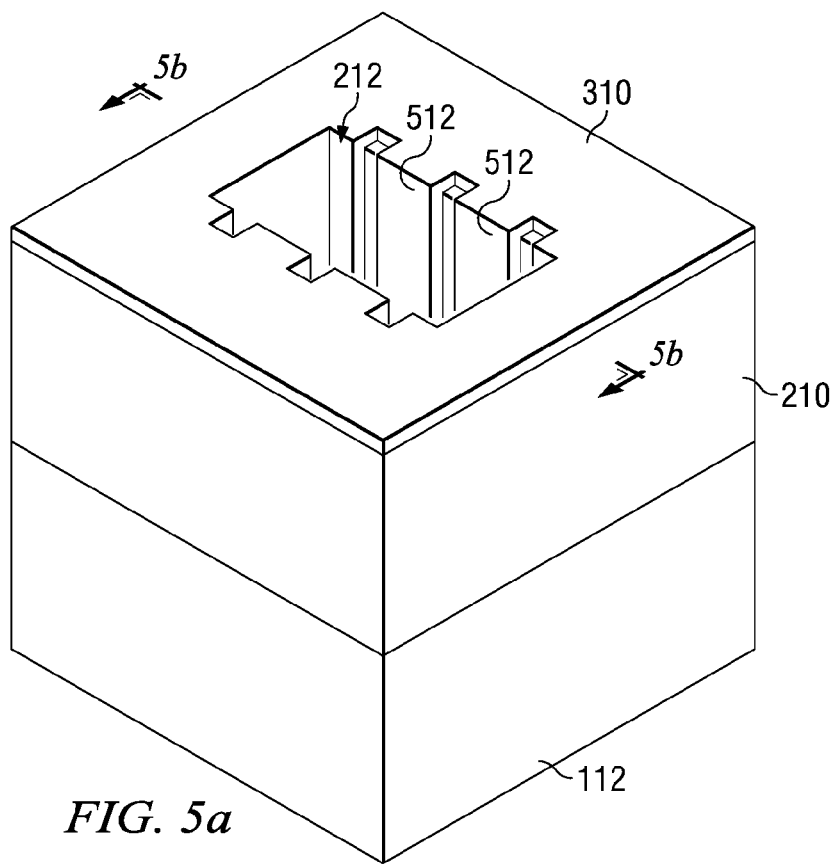
Figure 5B:
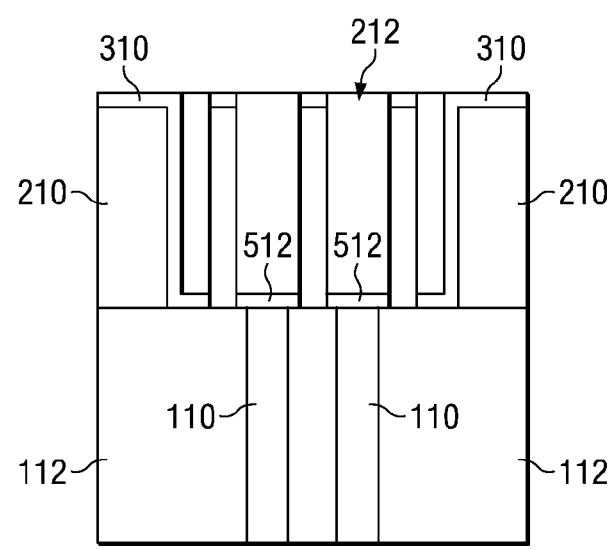

Accordingly, FIGS. 5a-5b illustrate the formation of heaters 512 by performing an isolation process in accordance with an embodiment of the present invention. The heaters 512 are the portion of the first metal layer 310 contained within the heater trench 212, excluding the ends of the heater trench 212. It should be noted that the embodiment illustrated in FIGS. 5a-5b illustrate an embodiment in which the end portions of the first metal layer 310 within the heater trench 212 remain, but are electrically isolated from the heaters 512. In other embodiments, such as those illustrated in FIGS. 9-11, the end portions of the first metal layer 310 may be removed.

The isolation process may be, for example, an etching process to remove the exposed portions of the first metal layer 310, an oxidation or implantation process to transform the exposed portions of the first metal layer 310 into a dielectric material, or the like. For example, in an embodiment in which the first metal layer 310 comprises TiN, TaN, or the like formed by an MOCVD or ALCVD process, the exposed portions of the first metal layer 310 may be etched using an anisotropic dry etch process. Other wet etch or isotropic etch processes, however, may be used. In an embodiment, the width of the exposed portions of the first metal layer 310 is between about 250 Å and about 5000 Å.

Figure 6A:
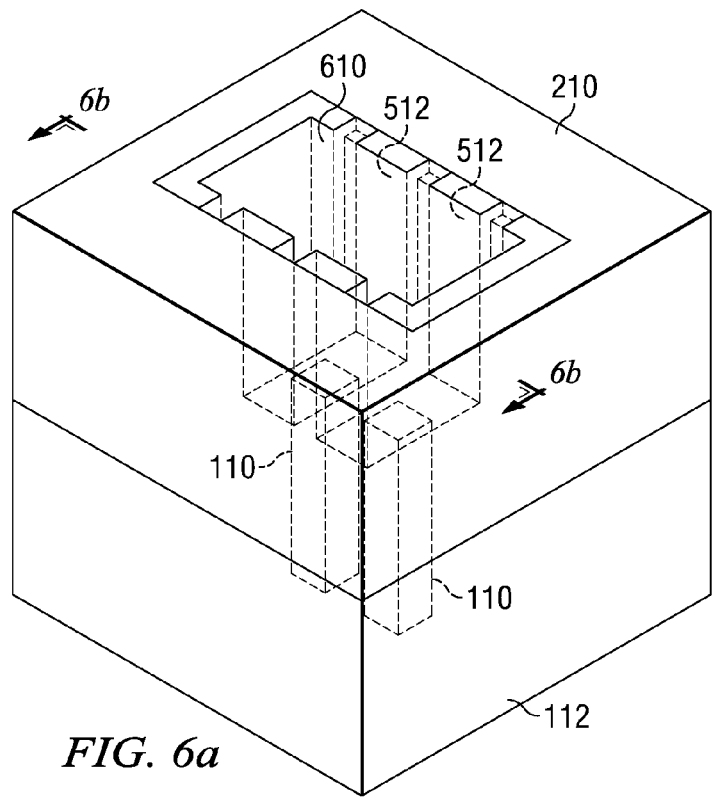
Figure 6B:
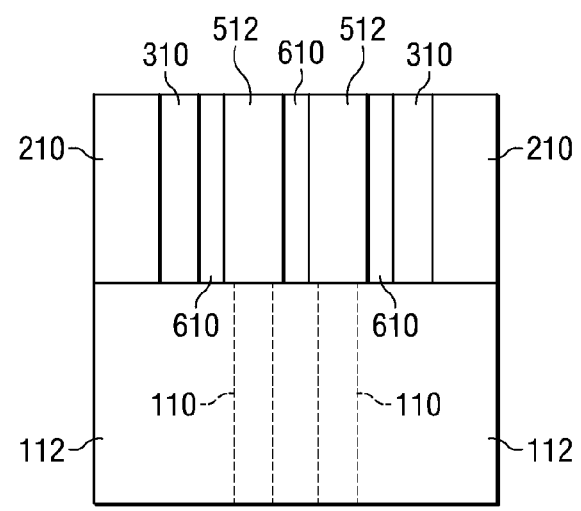

FIGS. 6a-6b illustrate the formation of a dielectric filler 610 in accordance with an embodiment of the present invention. The dielectric filler 610 is preferably a low-K dielectric material, such as silicon dioxide, silicon nitride, a combination thereof, or the like. In the preferred embodiment in which the dielectric filler 610 comprises a silicon dioxide layer, the dielectric filler 610 may be formed by chemical vapor deposition (CVD) techniques using tetra-ethyl-ortho-silicate (TEOS) and oxygen as a precursor. Other processes, such as high density plasma CVD (HDPCVD) and the like, may also be used.

Thereafter, a planarization process, such as a chemical-mechanical polishing (CMP) process, is performed in accordance with an embodiment of the present invention. The planarization process preferably removes excess portions of the dielectric filler 610 as well as portions of the first metal layer 310 extending over a top surface of the second dielectric layer 210, as illustrated in FIGS. 6a-6b. It should be noted that portions of the second dielectric layer may be removed during this process.

Figure 7A:
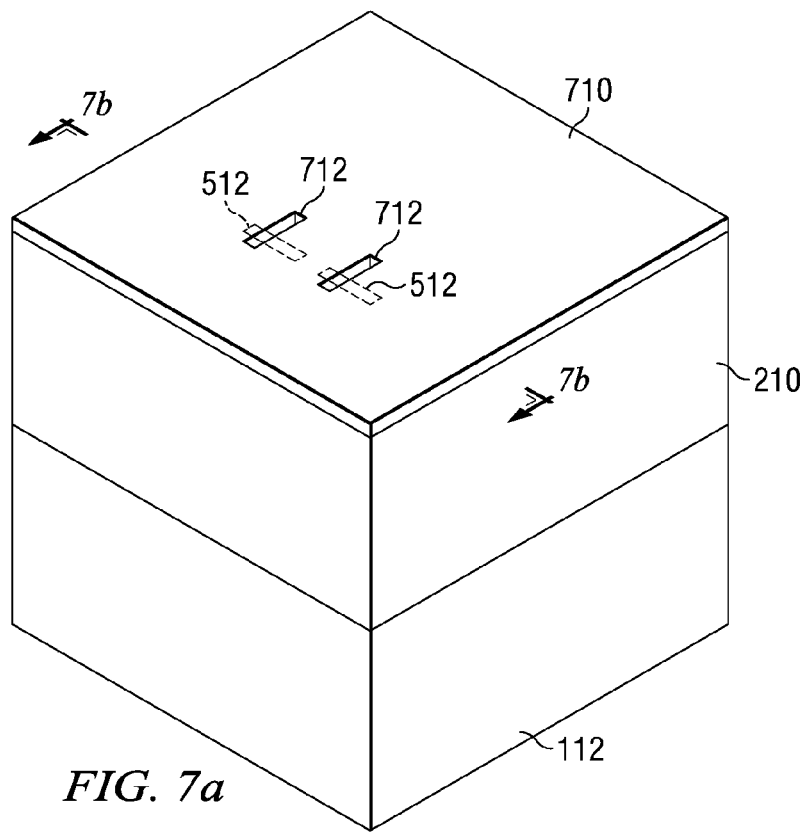
Figure 7B:
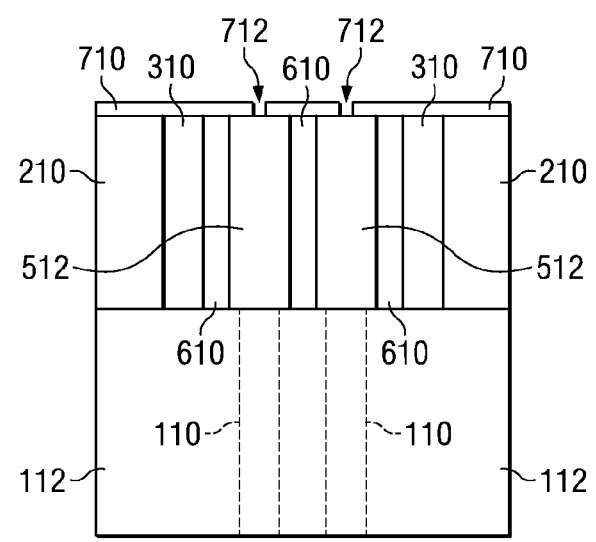

FIGS. 7a-7b illustrate a third dielectric layer 710 overlying the second dielectric layer 210, the first metal layer 310, and the dielectric filler 610 in accordance with an embodiment of the present invention. As illustrated in FIGS. 7a-7b, the third dielectric layer 710 has been patterned with trenches 712. The trenches 712 expose at least a portion of the underlying first metal layer 310.

The third dielectric layer 710 is preferably a low-K dielectric material, such as silicon dioxide, silicon nitride, silicon oxynitride, a combination thereof, or the like. In the preferred embodiment in which the third dielectric layer 710 comprises silicon nitride, the third dielectric layer 710 may be formed by CVD techniques. Other processes and materials may be used.

The trenches 712 may be formed by any suitable patterning technique and etching process. In an embodiment, a sub-litho process is used to reduce the contact area to the heaters 512. Generally, a sub-litho process involves forming trenches in a mask overlying a layer to be etched, in this case, the third dielectric layer 710. Prior to etching the third dielectric layer 710, spacers are formed alongside the sidewalls of the trenches in the mask. As a result, the exposed portions of the third dielectric layer 710 subjected to the etching process are reduced by the spacers, thereby allowing features smaller than the critical dimension to be formed. Alternatively, the trenches formed in the third dielectric layer 710 may correspond to standard lithographic processes, but dielectric spacers may be formed alongside the trenches formed in the third dielectric layer 710. In this alternative embodiment, while the trenches formed in the third dielectric layer 710 are not sub-litho dimensions, the exposed portions of the underlying heaters 512 are reduced to sub-litho dimensions by the use of additional spacers.

Figure 8A:
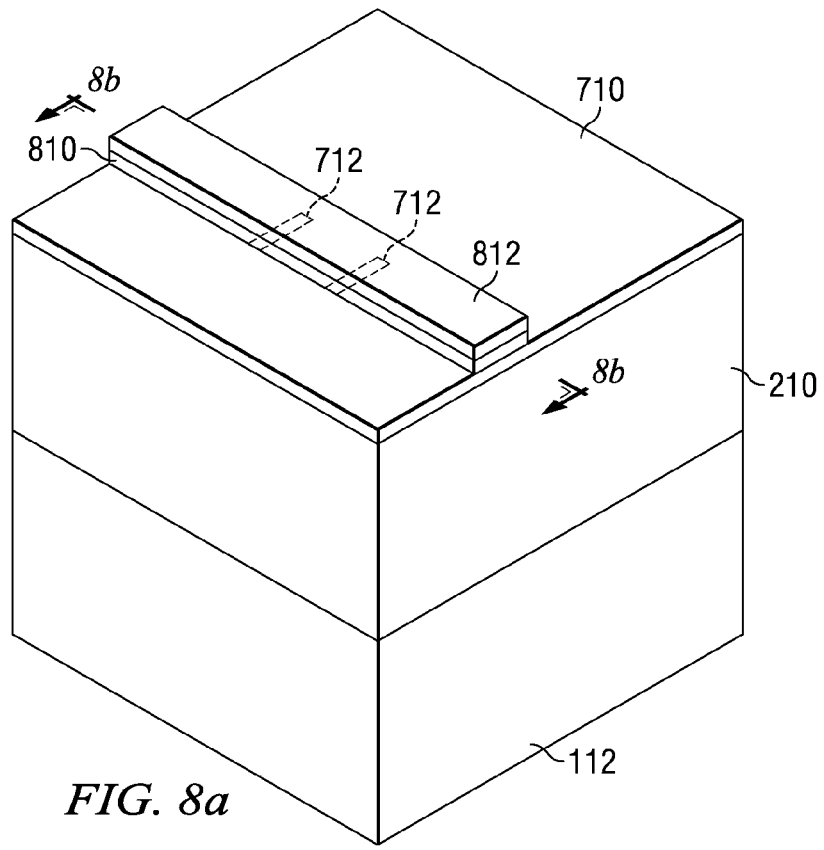
Figure 8B:
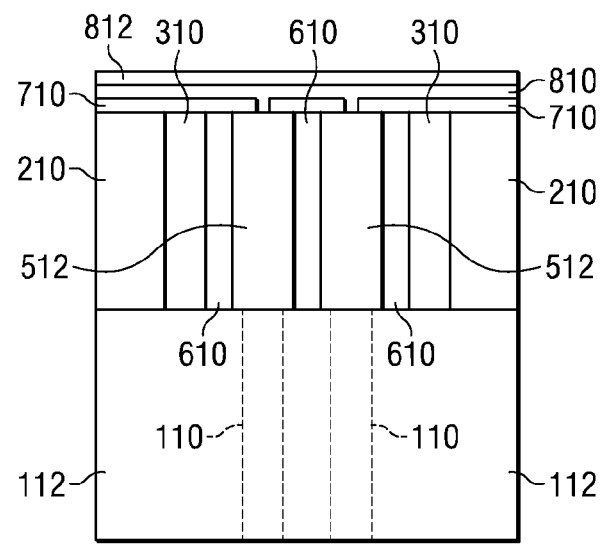

FIGS. 8a-8b illustrate the formation of a phase change layer 810 and a top electrode 812 in accordance with an embodiment of the present invention. The phase change layer 810, also sometimes referred to as a chalcogenide material layer, is formed within the trenches 712 (see FIGS. 7a-7b), contacting the heaters 512. In an embodiment, the phase change layer 810 comprises chalcogenide materials, preferably $Ge_xSb_yTe_z$, wherein x, y and z indicate the ratio of the respective numbers. In an exemplary embodiment, x is about 2, y is about 2, and z is about 5. The phase change layer 810 preferably has a thickness of between about 30 nm and about 150 nm, and more preferably between about 500 nm and about 1000 nm. The ratio of amorphous resistivity and crystalline resistivity of the phase change layer 810 can be as high as 5 orders, although the ratio may be lower. In an exemplary embodiment, the resistivity of the phase change layer 810 in the amorphous state is between about 1 Ω·cm and about 1E2 Ω·cm, and the resistivity of the same material in the crystalline state is between about 1E-5 Ω·cm and about 5E-3 Ω·cm. In alternative embodiments, phase change materials that can be symbolized as $Ge_xSb_yTe_zM$ are used, wherein M is a material selected from Ag, Sn, In, and combinations thereof.

The top electrode 812 is formed over the phase change layer 810. It has a preferred thickness of between about 20 nm and about 100 nm, and more preferably between about 30 nm and about 500 nm. In an embodiment, the top electrode 812 comprises TiN, TaN, or the like formed by MOCVD or ALCVD process. Other materials and other processes may be used. It should be noted that the top electrode 812 may include a plurality of layers and may include an adhesion layer to prevent or reduce peeling.

In an embodiment, the phase change layer 810 and the top electrode may be formed by depositing the respective layers as described above and using photolithography techniques to pattern the phase change layer 810 and the top electrode as illustrated in FIGS. 8a and 8b.

It should be noted that the heater 512 preferably has an electrical resistivity less than the resistivity of the phase change layer 810 in the crystalline state. Preferably, the resistance of the phase change layer 810 is about 40 times greater than the resistivity of the heater 512. Also, the resistivity of the heater 512 is preferably one order, and more preferably two orders higher than the resistivity of the contacts plugs 110, so that the heater 512 acts as a heating electrode while significantly less heat is generated in the contact plugs 110.

It should be noted that FIGS. 1-8 illustrate an embodiment in which the heaters 512 are u-shaped in a trench, with the heater formed along surfaces of opposing sidewalls and the bottom of a trench, and have a single contact to an underlying contact plug. Other embodiments having additional contacts to the underlying contact plugs, a fewer or greater number of heaters, as well as embodiments wherein the heater is split, may be used.

Figure 9:
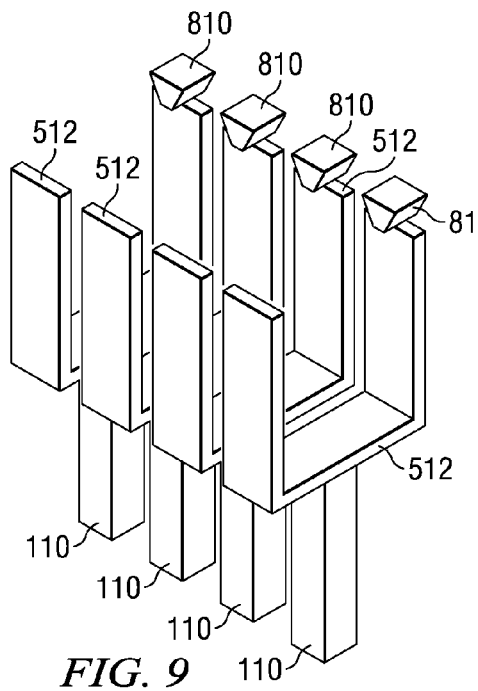
FIGS. 9-11 illustrate other embodiments of a phase change memory in accordance with an embodiment of the present invention.
Figure 10:
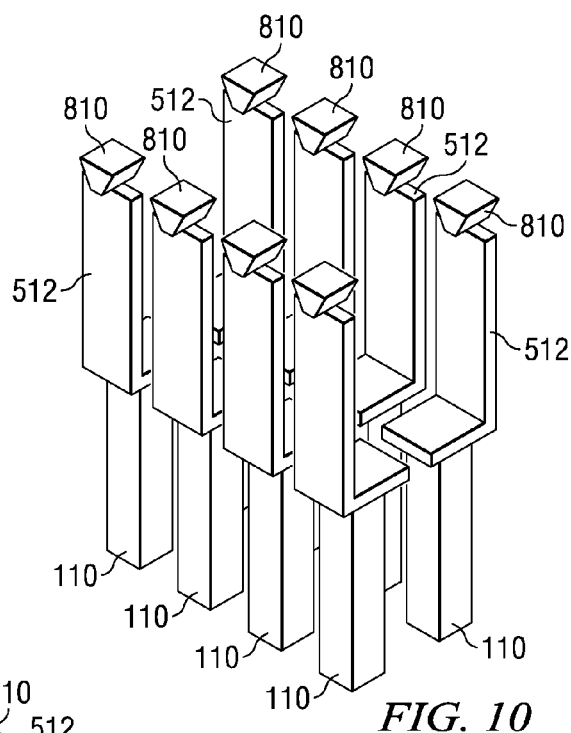

For example, FIGS. 9 and 10 illustrate alternative embodiments. It should be noted that FIGS. 9 and 10 illustrate only the contact plugs, heaters, and phase change material for illustrative purposes only. One of ordinary skill in the art will realize that other components, such as dielectric layers, insulation materials, and the like, are also included. In particular, FIG. 9 illustrates an embodiment in which four heater elements are formed, and FIG. 10 illustrates an embodiment in which eight heater elements are formed. With reference to FIG. 10, it should be noted that the heater elements are formed in a similar manner as in FIGS. 1-8 and FIG. 9, wherein the portion of the heater element along the bottom of the trench is separated into two elements. In this embodiment, contact plugs may be formed contacting each heater element. This embodiment may be used to further increase the density.

Figure 11:
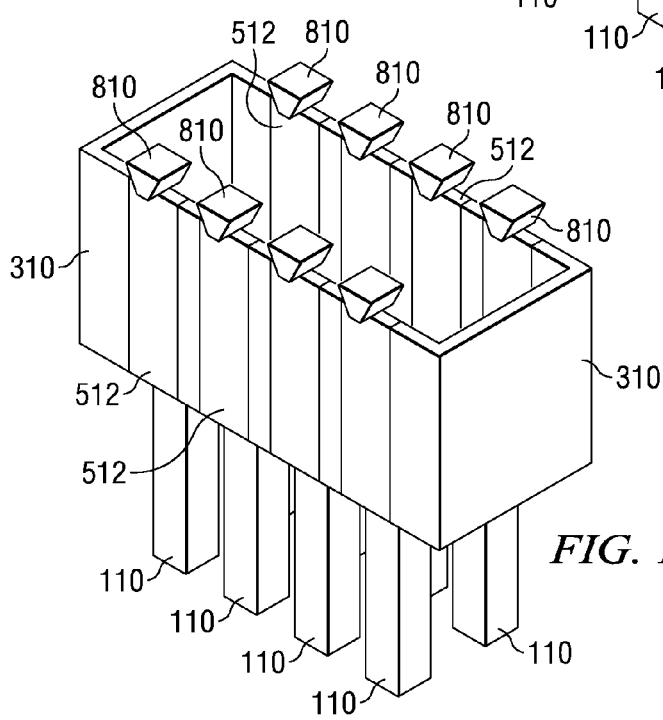

FIG. 11 illustrates yet another embodiment of the present invention. FIG. 11 corresponds to the heater structure discussed above with reference to FIG. 10, but illustrates that the end portions of the metal liner from which the heaters are formed may be removed or oxidized. FIG. 11 illustrates the embodiment in which portions of the metal layer that do not form the heaters are transformed into a dielectric material using an oxidation or implantation process.

Although the present invention and its advantages have been described in detail, it should be understood that various changes, substitutions and alterations can be made herein without departing from the spirit and scope of the invention as defined by the appended claims. For example, different types of materials and processes may be varied while remaining within the scope of the present invention.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor device comprising:
    a substrate having an electrical component formed thereon;
    a first dielectric layer overlying the substrate;
    a contact plug extending at least partially through the first dielectric layer, the contact plug being electrically coupled to the electrical component;
    a second dielectric layer overlying the first dielectric layer;
    a trench in the second dielectric layer;
    a heater along at least a portion of sidewalls of the trench, the heater comprising a plurality of sections separated by a dielectric material, each section extending down at least a portion of one sidewall of the trench, said heater being electrically coupled to the contact plug;
    a third dielectric layer substantially filling the trench; and
    a phase change material overlying and electrically coupled to the heater.

2. The semiconductor device of claim 1, wherein the heater comprises titanium nitride or tantalum nitride.

3. The semiconductor device of claim 1, wherein the heater has a thickness from about 50 Å to about 200 Å.

4. The semiconductor device of claim 1, wherein the phase change material is positioned in a micro trench of a fourth dielectric layer, the fourth dielectric layer overlying the third dielectric layer.

5. The semiconductor device of claim 4, wherein at least two of the first dielectric layer, the second dielectric layer, the third dielectric layer, and the fourth dielectric layer are of different materials.

6. The semiconductor device of claim 4, wherein the micro trench has a width of about 5 nm to about 30 nm.

7. The semiconductor device of claim 1, wherein the phase change material comprises $Ge_xSb_yTe_z$, wherein x, y, and z indicate a ratio of each respective element.

8. The semiconductor device of claim 1, further comprising a top electrode overlying and electrically coupled to the phase change material.

9. A semiconductor device comprising:
    a substrate having a plurality of electrical components formed thereon;
    a first dielectric layer overlying the substrate;
    a plurality of contact plugs extending at least partially through the first dielectric layer, the plurality of contact plugs being electrically coupled to respective ones of the plurality of electrical components;
    a second dielectric layer overlying the first dielectric layer;
    a trench in the second dielectric layer;
    a plurality of heaters in the trench, each of the heaters having a first portion along at least one sidewall of the trench, the first portion being cornerless;
    a third dielectric layer over the plurality of heaters substantially filling the trench;
    a phase change layer overlying and contacting each of the plurality of heaters; and
    a top electrode overlying at least a portion of and electrically coupled to the phase change layer.

10. The semiconductor device of claim 9, wherein the plurality of heaters comprises titanium nitride or tantalum nitride.

11. The semiconductor device of claim 9, wherein each of the plurality of heaters has a thickness from about 50 Å to about 200 Å.

12. The semiconductor device of claim 9, wherein the phase change layer is positioned in a micro trench of a dielectric layer, the dielectric layer overlying the plurality of heaters.

13. The semiconductor device of claim 12, wherein the micro trench has a width of about 5 nm to about 30 nm.

14. The semiconductor device of claim 9, wherein the phase change layer comprises $Ge_xSb_yTe_z$, wherein x, y, and z indicate a ratio of each respective element.

15. A semiconductor device comprising:
    a substrate having a plurality of electrical components formed thereon;
    a first dielectric layer overlying the substrate;

a plurality of contact plugs extending through the first dielectric layer, the plurality of contact plugs being electrically coupled to respective ones of the plurality of electrical components;

a second dielectric layer overlying the first dielectric layer;

a trench in the second dielectric layer exposing the plurality of contact plugs;

a plurality of heaters in the trench, each of the heaters extending along a sidewall of the trench;

a third dielectric layer over the plurality of heaters substantially filling the trench;

a phase change layer overlying and electrically coupled to each of the plurality of heaters; and a top electrode overlying at least a portion of and electrically coupled to the phase change layer.

16. The semiconductor device of claim 15, wherein the plurality of heaters comprises titanium nitride or tantalum nitride.

17. The semiconductor device of claim 15, wherein each of the plurality of heaters has a thickness from about 50 Å to about 200 Å.

18. The semiconductor device of claim 15, further comprising a fourth dielectric layer overlying the third dielectric layer, wherein the phase change layer is positioned in a micro trench of and extends through the fourth dielectric layer.

19. The semiconductor device of claim 18, wherein the micro trench has a width of about 5 nm to about 30 nm.

20. The semiconductor device of claim 15, wherein the phase change layer comprises $Ge_xSb_yTe_z$, wherein x, y, and z indicate a ratio of each respective element.

* * * * *